(12) United States Patent
Lueker et al.

(10) Patent No.: US 7,218,545 B2
(45) Date of Patent: May 15, 2007

(54) POLYMER DE-IMPRINT CIRCUIT USING NEGATIVE VOLTAGE

(75) Inventors: Jonathan C. Lueker, Portland, OR (US); Richard L Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 10/973,580

(22) Filed: Oct. 25, 2004

(65) Prior Publication Data

US 2006/0087875 A1    Apr. 27, 2006

(51) Int. Cl.
*G11C 11/22* (2006.01)
(52) U.S. Cl. .................. 365/145; 365/149; 365/189.01
(58) Field of Classification Search ................ 365/145, 365/149, 189.01, 117, 121
See application file for complete search history.

(56) References Cited

U.S. PATENT DOCUMENTS

| | | | | |
|---|---|---|---|---|
| 5,835,399 | A * | 11/1998 | Jeon ........................... | 365/145 |
| 5,953,245 | A * | 9/1999 | Nishimura .................. | 365/145 |
| 6,522,567 | B2 * | 2/2003 | Iwanari ...................... | 365/145 |
| 6,522,570 | B1 * | 2/2003 | Basceri et al. .............. | 365/145 |
| 6,922,350 | B2 | 7/2005 | Coulson et al. | |
| 6,922,351 | B2 * | 7/2005 | Natori et al. ................ | 365/145 |
| 2004/0190322 | A1 * | 9/2004 | Baumann et al. ........... | 365/145 |

* cited by examiner

*Primary Examiner*—Gene N. Auduong
(74) *Attorney, Agent, or Firm*—Cyndi M. Wheeler

(57) ABSTRACT

Briefly, voltages to write a memory cell are adjusted if the memory cell is determined to be imprinted. In one embodiment, a positive voltage not including zero is applied to one of a bit line and a word line and a negative voltage not including zero is applied to another of the bit line and the word line to write a specified logic state to an imprinted memory cell. Neighboring cells do not receive disturb voltages in excess of a disturb voltage threshold.

24 Claims, 7 Drawing Sheets

POLYMER DE-IMPRINT CIRCUIT USING NEGATIVE VOLTAGE

BACKGROUND

Description of the Related Art

In some memories, after an extended period of time, a memory cell that is polarized in one direction may become imprinted in that direction. A cell may be de-imprinted by fully reversing the polarization one or more times. However, as a cell becomes imprinted, an increasing amount of voltage is required to de-imprint the cell. Increased voltages may cause excess disturb voltages on neighboring cells, affecting memory performance. System designers are searching for ways to provide sufficient voltage to de-imprint a memory cell without exceeding a disturb voltage threshold for neighboring cells.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

In the following description, numerous specific details are set forth. However, it is understood that embodiments of the invention may be practiced without these specific details. In other instances, well-known methods, structures and techniques have not been shown in detail in order not to obscure an understanding of this description.

References to "one embodiment," "an embodiment," "example embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

In the following description and claims, the terms "include" and "comprise," along with their derivatives, may be used, and are intended to be treated as synonyms for each other. In addition, in the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Unless specifically stated otherwise, as apparent from the following discussions, it is appreciated that throughout the specification discussions utilizing terms such as "processing," "computing," "calculating," or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data from registers and/or memory to transform that electronic data into other electronic data that may be stored in registers and/or memory. A "computing platform" may comprise one or more processors.

In the following description and claims, the term "data" may be used to refer to both data and instructions. In addition, the term "information" may be used to refer to data and instructions.

Figure 1:
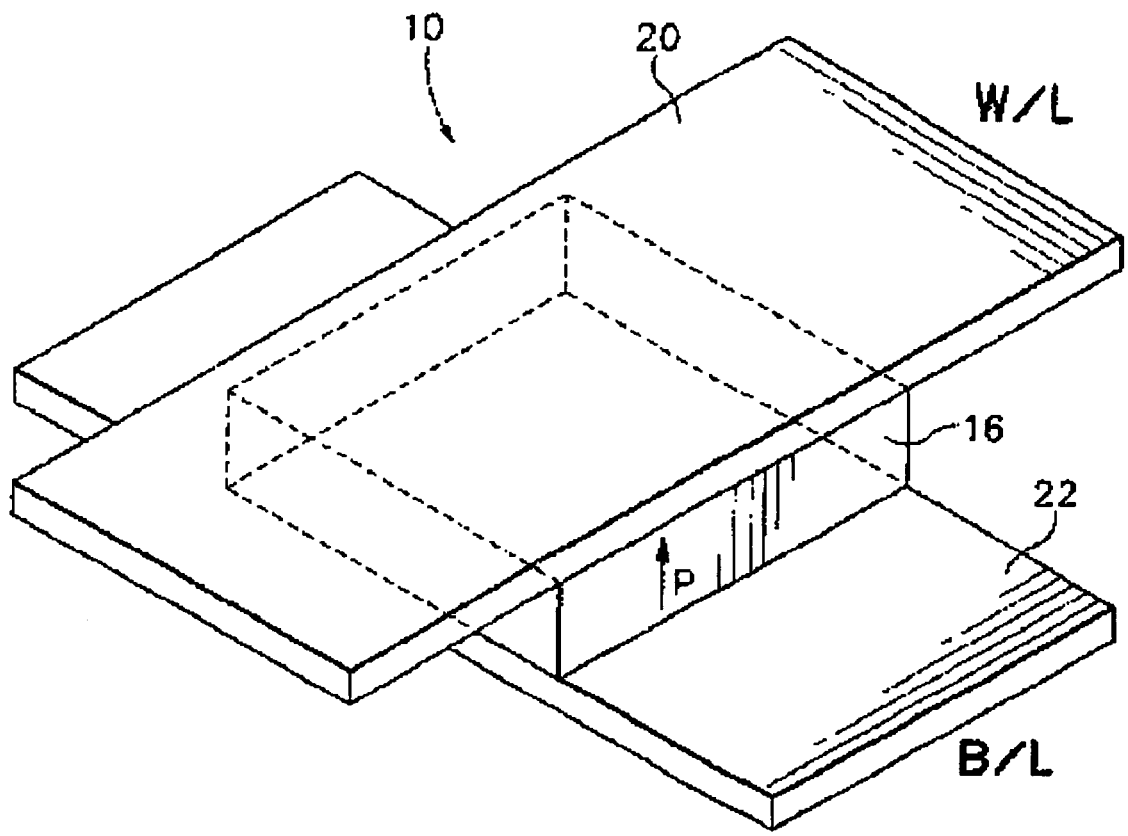
FIG. 1 illustrates a diagram illustrating a portion of a ferroelectric memory cell according to an embodiment of the present invention.

FIG. 1 is a diagram illustrating a portion of one type of a ferroelectric memory cell 10 that may be used in embodiments of the present invention. Ferroelectric memory is a type of non-volatile memory that utilizes the ferroelectric behavior of certain materials to retain data in a memory device in the form of positive and negative polarization, even in the absence of electric power. A ferroelectric material 16 may contain domains of similarly oriented electric dipoles that retain their orientation unless disturbed by some externally imposed electric force. The polarization of the material characterizes the extent to which these domains are aligned. The polarization can be reversed by the application of an electric field of sufficient strength and polarity.

Ferroelectric material 16 may be a ferroelectric polymer polarizable material, and may also be referred to as a ferroelectric polarizable material or a dipole ferroelectric material. In various embodiments, the ferroelectric polymer material may comprise a polyvinyl fluoride, a polyethylene fluoride, a polyvinyl chloride, a polyethylene chloride, a polyacrylonitrile, a polyamide, copolymers thereof, or combinations thereof. Another example of a ferroelectric material may include a ferroelectric oxide material.

Ferroelectric material 16 having a polarization P may be located between a conductive word line (W/L) 20 and a conductive bit line (B/L) 22. An electric field may be applied to the ferroelectric cell by applying an electric potential (voltage) between word line 20 and bit line 22 so as to effect changes in the polarization of ferroelectric material 16.

Figure 2:
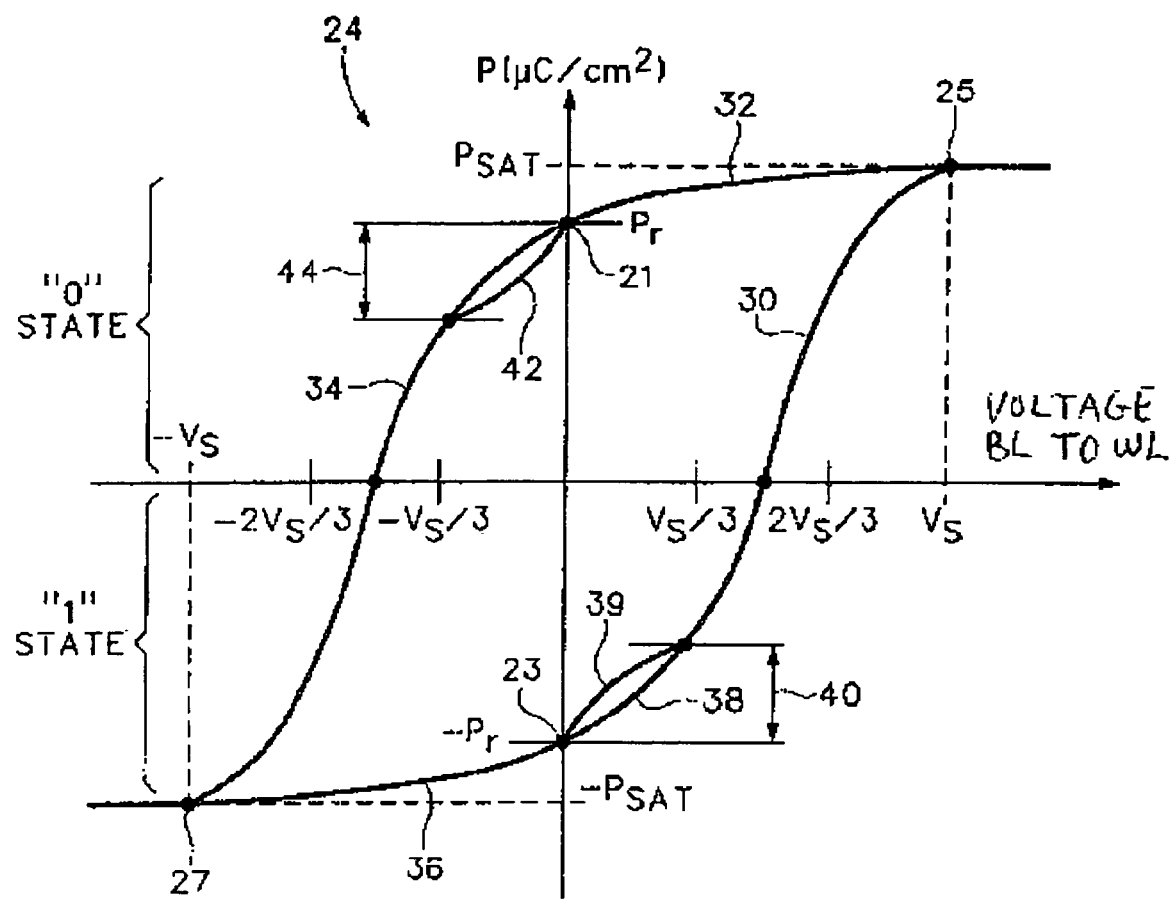
FIG. 2 is a graph of the polarization versus voltage properties of a ferroelectric cell according to an embodiment of the present invention.

FIG. 2 shows a simplified hysteresis curve 24 that illustrates idealistically the polarization versus voltage properties of the ferroelectric cell of FIG. 1. When a positive voltage (e.g., $V_{bit\ line} - V_{word\ line} > 0$) of sufficiently large magnitude (shown here, for example, as Vs) is applied to the cell, all of the domains in the cell are forced to align, to the extent possible, in the positive direction, and the polarization P reaches the saturation polarization Psat at point 25 on the curve. A further increase in the voltage produces no further increase in the polarization because all of the domains are already aligned as far as possible in the direction of the electric field produced by the voltage between the word line and bit line. In one example, a positive voltage may be applied by applying Vs, for example, about 9 volts, to bit line 22 and applying about 0 volts to word line 20. In another example, two non-zero positive voltages may be applied to bit line 22 and word line 20 to generate a positive voltage across material 16. Note that the voltages applied to achieve Vs may vary with specific implementations and the scope of the present invention is not limited in this respect.

If the voltage is then reduced to 0 V(following path 32 to arrive at point 21), some of the domains switch their orientation (also referred to as rotating, flipping or reversing), but most of the domains retain their orientation. Thus, the ferroelectric material retains a remnant polarization Pr.

For purposes of data storage, ferroelectric cell 10 is considered to be in the logic "0" (zero) state when the polarization P is positive (preferably at Pr), and the logic "1" (one) state when the polarization is negative (preferably at −Pr). The assignment of a logic "1" or logic "0" to a positive or negative polarization is arbitrary, and in other embodiments, opposite conventions may be used.

If a negative voltage of sufficiently large magnitude (shown here, for example, as −Vs) is then applied to the word line 20 relative to bit line 22 (following path 34 to point 27), all of the domains are forced to switch their orientation, and the polarization reaches the negative saturation level −Psat. Removing this negative voltage (following path 36 to point 23) allows some of the domains to switch, and the cell polarization reaches the negative remnant polarization −Pr. If the positive voltage Vs is again applied to the cell (following path 30 to point 25), the domains once again switch their orientation, and the cell takes on the positive saturation polarization Psat until the voltage is removed, and the polarization reaches the positive saturation level +Pr.

Ferroelectric materials also exhibit resilience, wherein a ferroelectric cell may return close to its remnant polarization despite a small disturbance. During an access cycle, bit lines and word lines of neighboring cells may be driven with voltages that provide quiescent level electric fields across the neighboring ferroelectric cells. Quiescent level voltages may be defined in accordance with the resilient qualities of the ferroelectric cell, wherein polarization disturbances of the cells are kept within a recovery range. For example, in accordance with one embodiment of the present invention, the quiescent level, also referred to as a disturb voltage threshold, may be set to a magnitude no greater than ⅓ the switching level voltage. For example, assuming a one state storage condition for a ferroelectric cell, as represented by remnant polarization position 23 of hysteresis curve 24, a small voltage disturbance of Vs/3 may provide a small polarization shift 40 along path 38. However, once the voltage is removed, a large portion of the domains of the ferroelectric cell may realign their orientations to that of the cell's overall orientation, as illustrated by return path 39 of hysteresis curve 24. Note that the return path may not return to position 23 but to a point slightly above position 23. Many small voltage disturbances may accumulate overtime, moving the storage condition along path 38 and affecting memory performance. Large voltage disturbances, for example, when the voltage is greater than Vs/3, may move the charge of the cell significantly closer to position 25 along path 30 of hysteresis curve 24. Additionally, a large negative voltage disturbance, for example, a voltage more negative than −Vs/3, may move the charge of the cell significantly closer to position 27 along path 34 of hysteresis curve 24. It is desirable to keep voltage disturbances to a minimum, preferably below the disturb voltage threshold. Thus, there may be only a narrow operating window in which the drive voltage is sufficiently high and in which the disturb voltage of Vs/3 is sufficiently low.

Figure 3:
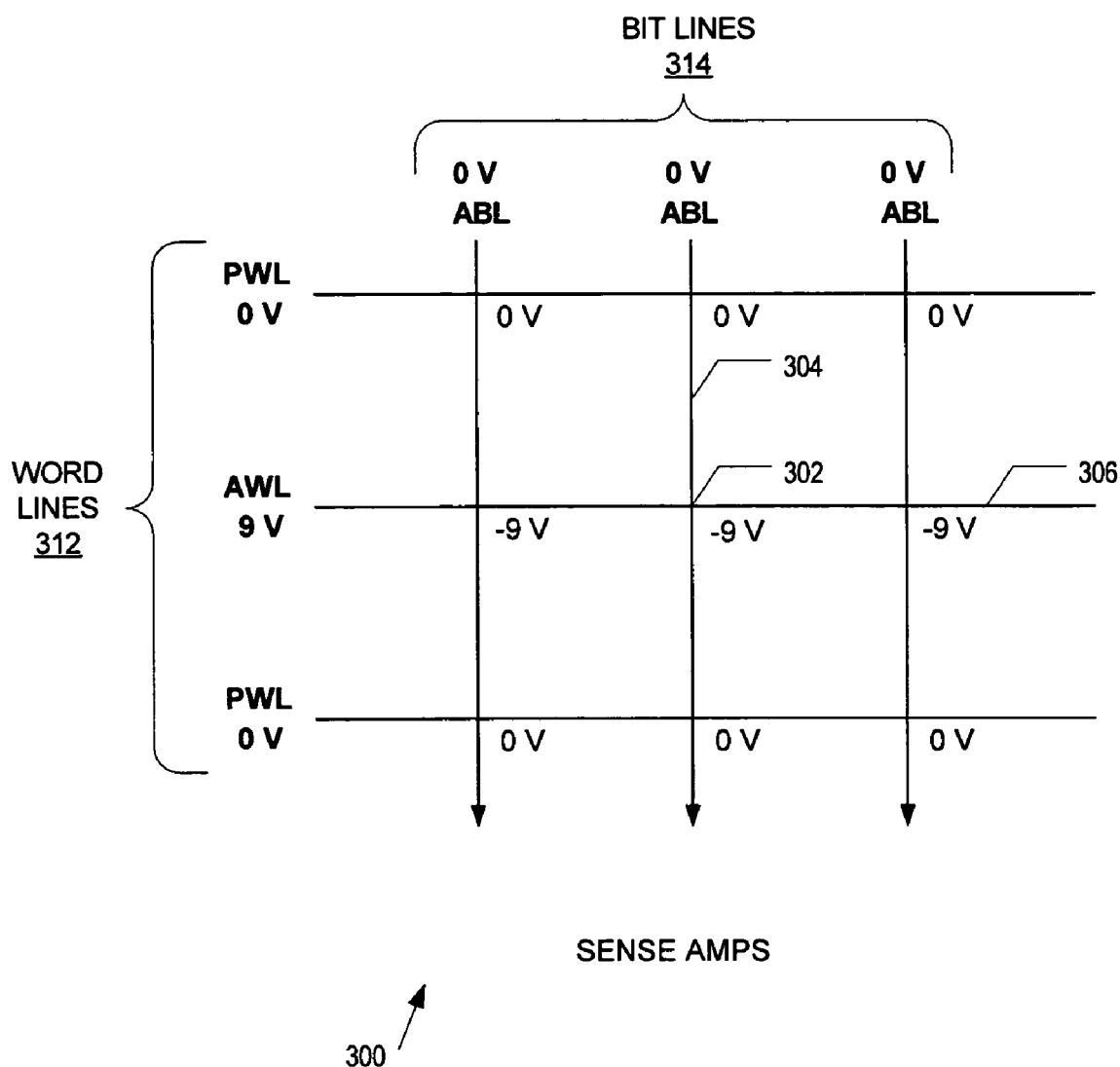
FIG. 3 is a block diagram illustrating a read access of a ferroelectric memory device according to an embodiment of the present invention.

FIG. 3 is a block diagram illustrating a read access of a ferroelectric memory device 300 in accordance with an embodiment of the present invention. Memory device 300 includes a cross-point passive matrix memory array having word lines 312 that cross bit lines 314. Ferroelectric material such as, for example, a ferroelectric polymer material, may be disposed between the word lines and bit lines to form ferroelectric cells at the intersections of word lines and bit lines. For example, a ferroelectric cell 302 is located at the crossing of the word line identified as 306 and the bit line identified as 304 in FIG. 3. In this example, cell 302, as well as other cells on word line 306, is referred to as "lactive" because it identifies a specific cell that has been selected to read. The word line coupled to the active cell is identified as an active word line (AWL), whereas the remaining word lines are passive word lines (PWL). Likewise, the bit line coupled to the active cell is identified as the active bit line (ABL), whereas the remaining bit lines are passive bit lines (PBL). As illustrated in this example, all cells along word line 306 are being read, thus all bit lines 314 are active. Passive word lines and bit lines may also referred to as unselected word lines and bit lines. Active word lines and bit lines may also be referred to as selected, addressed, or target word lines and bit lines.

When accessing an active cell, an access or switching level voltage may be applied to the active word line 306. The access level voltage has a magnitude that is defined as $(V_{bitline} - V_{wordline})$, and is sufficient to effect a polarization reversal of the active cell 302. As illustrated, a read cycle is performed by raising the active word line (AWL) 306 to some voltage, for example, 9 volts. The bit lines 314 are held at 0 volts by their sense amplifier's input, which act as virtual grounds. Cells that reverse their polarization in response to the 9 volts release a larger charge, while cells that do not reverse polarization release a smaller charge. By detecting the amount of charge, each sense amp determines whether a cell has reversed its polarization and thus whether it contained a 1 or a 0. Note that as a consequence of the read cycle, all cells on the active word line are left in the 1 state.

Figure 4:
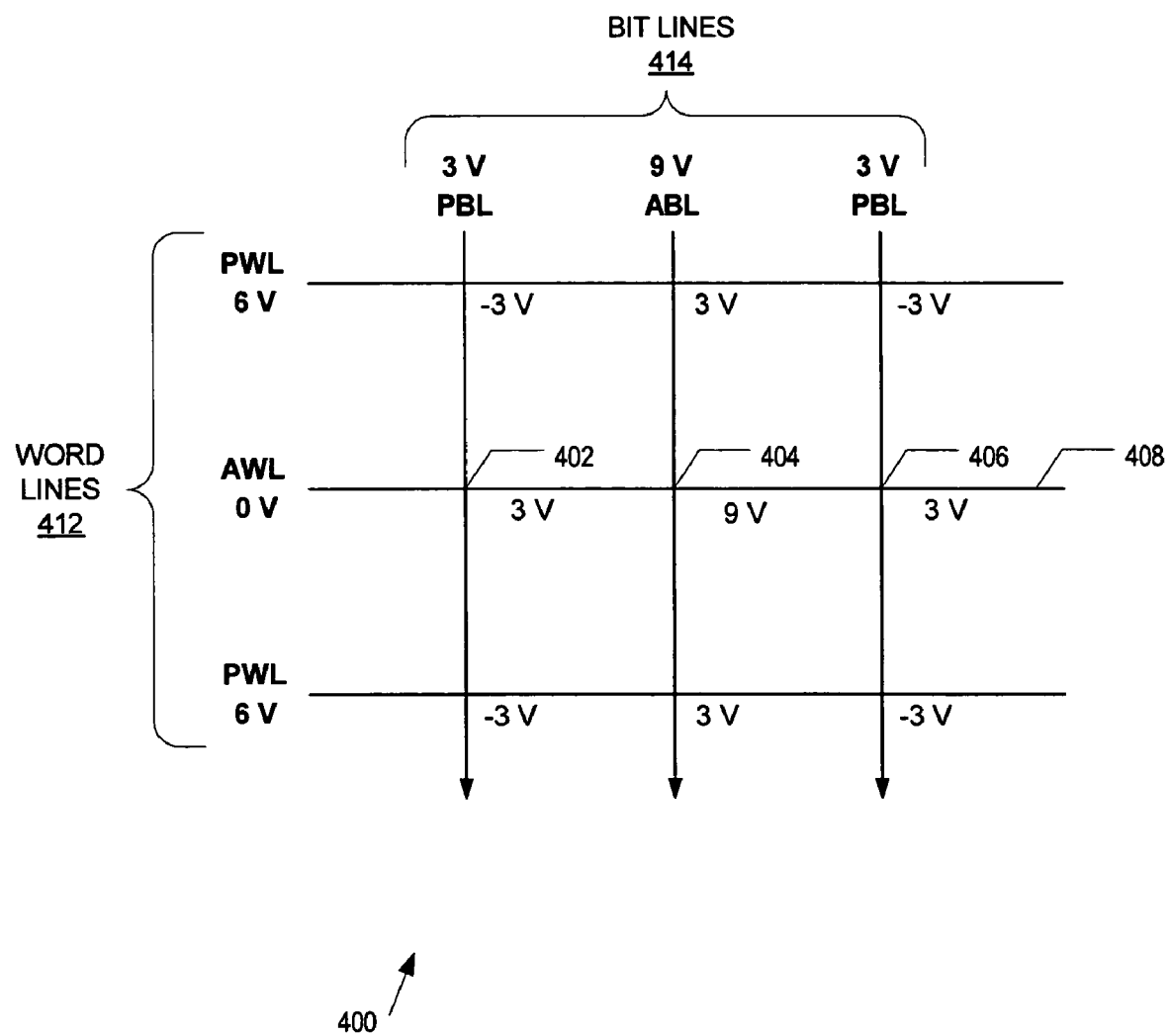
FIG. 4 is a block diagram illustrating a write access of a ferroelectric memory device according to an embodiment of the present invention.

FIG. 4 is a block diagram illustrating a write access of a ferroelectric memory device 400 in accordance with an embodiment of the present invention. Memory device 400 includes a cross-point passive matrix memory array having word lines 412 that cross bit lines 414. As illustrated, a write cycle is performed by setting active word line 408 to 0 volts, and the passive word lines to 6 volts. The bit lines for the addressed cells which are to be written to the 0 state are set to 9 volts, and the bit lines for the addressed cells which are to remain in a 1 state are set to 3 volts. In FIG. 4, cell 404 is written to a logic 0 state and cells 402 and 406 remain in a logic 1 state.

As illustrated in FIGS. 3 and 4, in order to keep disturb voltages below the disturb voltage threshold of Vs/3 during read and write cycles, voltages may be applied to the passive bit and word lines. Thus, only the active cells are read or written.

When cells become highly imprinted, Vs may no longer be sufficient to change a cell's polarization. When writing imprinted cells, the voltage applied cannot simply be increased above Vs on active bit lines because neighboring cells would receive disturb voltages in excess of the disturb voltage threshold, adversely affecting cell performance.

According to an embodiment of the present invention, two new write operations are used for imprinted cells, a write hard zero operation and a write hard one operation. These operations allow imprinted cells to be cycled with a voltage higher than Vs while holding disturb voltages on neighboring cells at or below the disturb voltage threshold, Vs/3. Cycling at elevated voltages reduces imprint.

Figure 5:
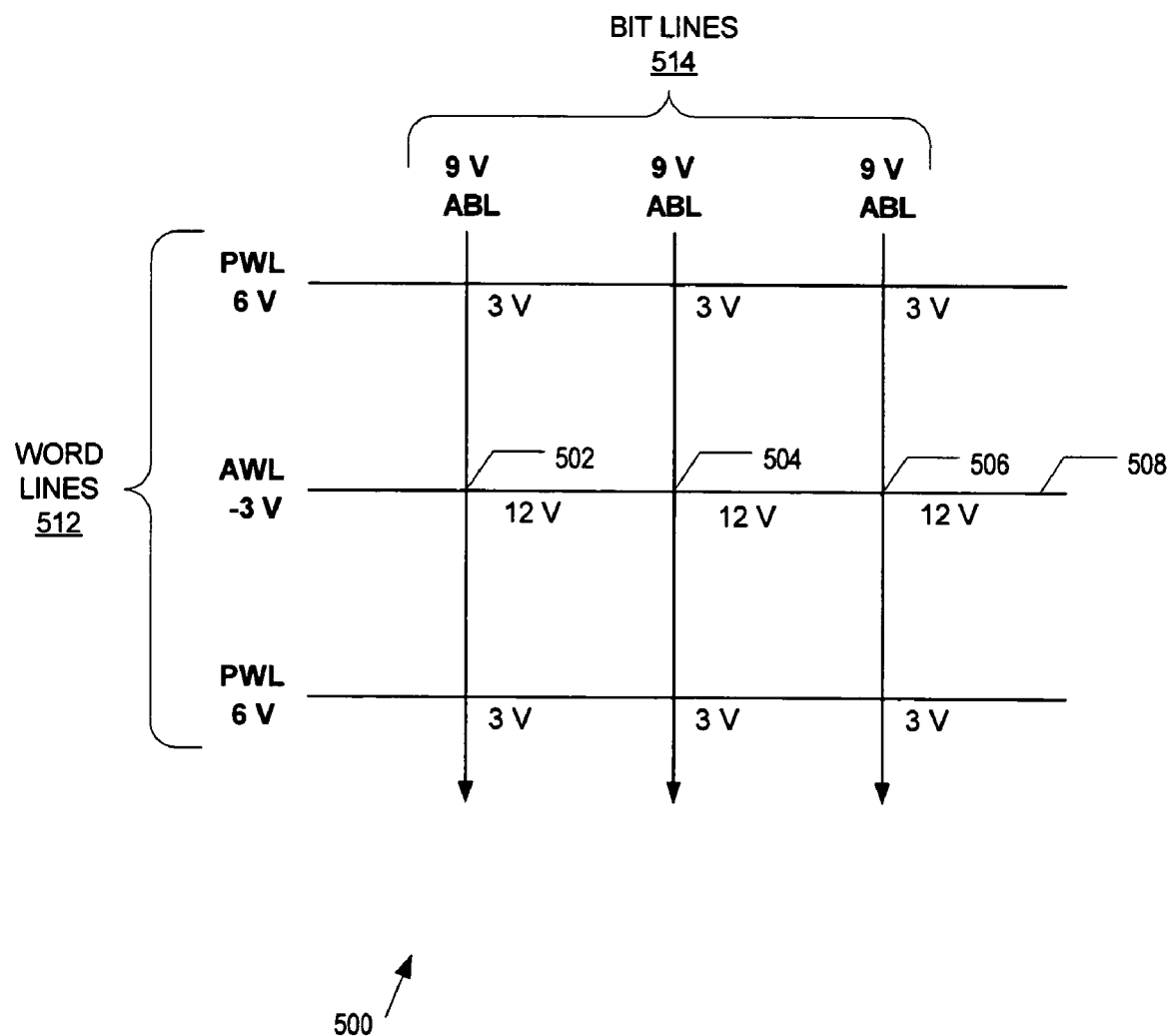
FIG. 5 is a block diagram illustrating a write hard zero access of a ferroelectric memory device according to an embodiment of the present invention.

FIG. 5 is a block diagram illustrating a write hard zero access of a ferroelectric memory device according to an embodiment of the present invention. Memory device 500 includes a cross-point passive matrix memory array having word lines 512 that cross bit lines 514. As illustrated, a write hard zero cycle is performed by setting active word line 508 to negative 3 volts, and the passive word lines to 6 volts. The bit lines for the addressed cells are set to 9 volts. In FIG. 5, cells 502, 504 and 506 are subjected to a de-imprint voltage of 12 volts, while neighboring cells are subjected to a disturb voltage of only 3 volts.

Figure 6:
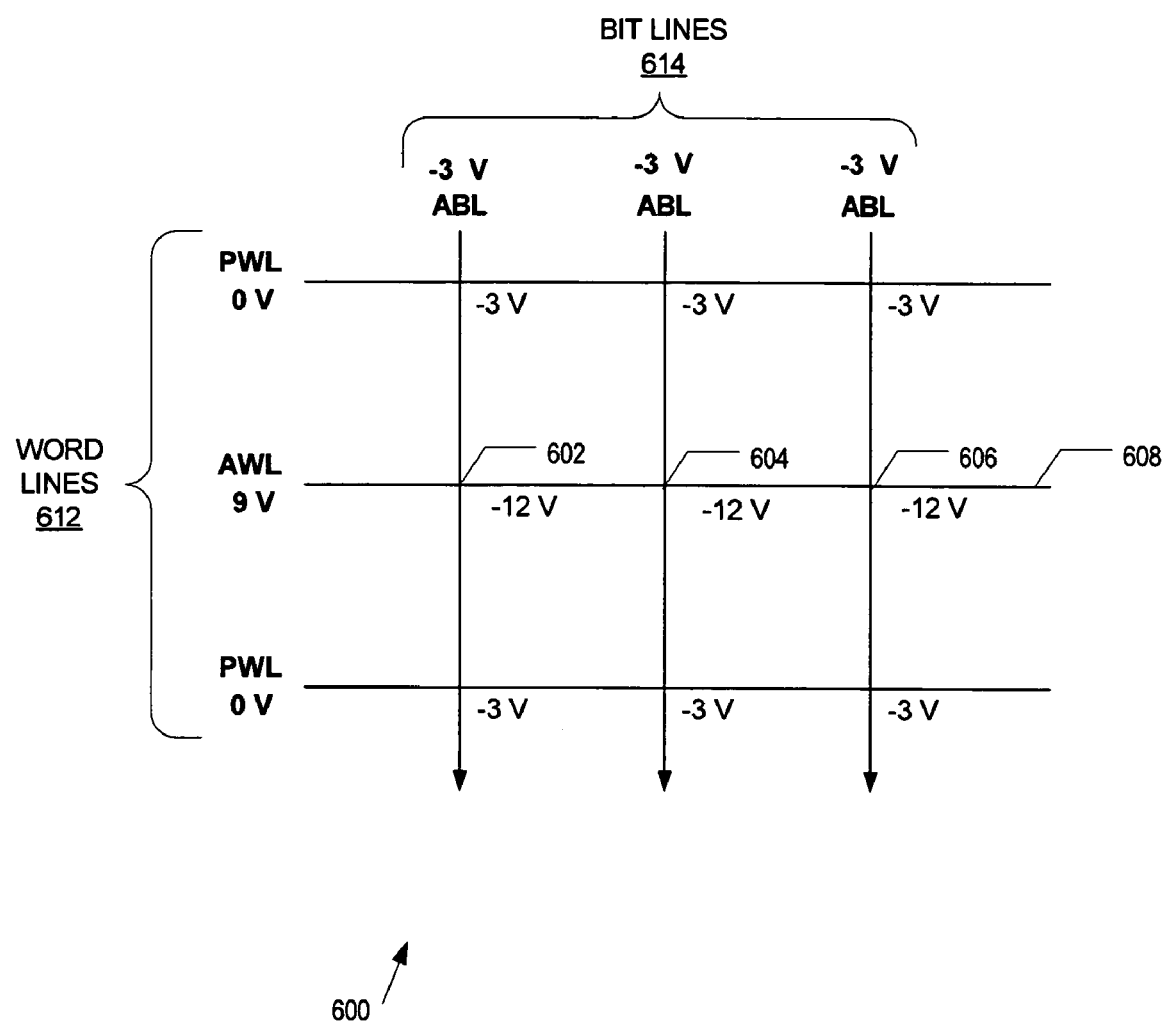
FIG. 6 is a block diagram illustrating a write hard one access of a ferroelectric memory device according to an embodiment of the present invention.

FIG. 6 is a block diagram illustrating a write hard one access of a ferroelectric memory device according to an embodiment of the present invention. Memory device 600 includes a cross-point passive matrix memory array having word lines 612 that cross bit lines 614. As illustrated, a write hard one cycle is performed by setting active word line 608 to 9 volts, and the passive word lines to 0 volts. The bit lines for the addressed cells are set to negative 3 volts. In FIG. 6, cells 602, 604 and 606 are subjected to a de-imprint voltage of negative 12 volts, while neighboring cells are subjected to a disturb voltage of only negative 3 volts.

According to the present invention, a higher de-imprint drive voltage is achieved while maintaining low disturb voltages. In addition, the disturb voltages are approximately equal and opposite for write hard zero and write hard one operations.

Figure 7:
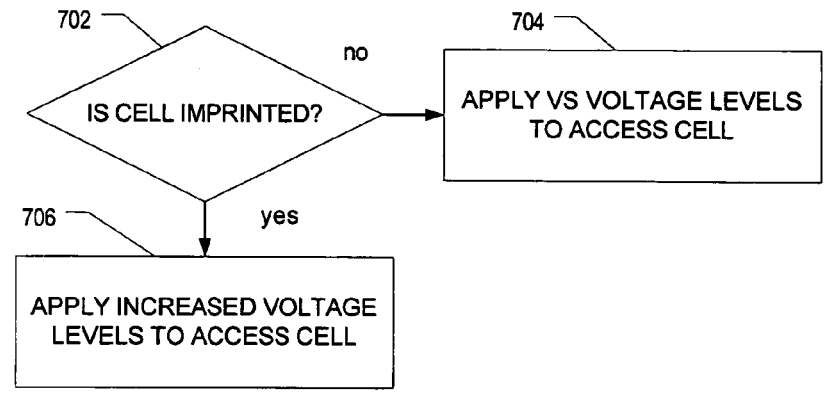
FIG. 7 illustrates a flow diagram for de-imprinting imprinted memory cells according to an embodiment of the present invention.

FIG. 7 illustrates a flow diagram for de-imprinting imprinted memory cells according to an embodiment of the present invention. A determination is made whether a memory cell is imprinted, block 702. Timers may be used to track access histories of particular cells or groups of cells. Alternatively, if a system has been powered down, an assumption may be made that the cells are imprinted. If the cells are determined not to be imprinted, Vs voltages levels are applied to access the cell, block 704. For example, 9 V may be applied to active bit lines and 0 V applied to active word lines to write a cell to a 0 state. Passive word lines may receive 6 V to avoid disturb voltages in excess of the disturb voltage threshold, for example, Vs/3. If the cells are determined to be imprinted, increased voltage levels are applied to access the cell, block 706. This may be achieved by applying a negative voltage, for example negative 3 volts to the active word lines and 9 V to the active bit lines to de-imprint a cell in a write hard zero operation. Passive word lines may receive 6 V to avoid disturb voltages on neighboring cells in excess of the disturb voltage threshold, for example, Vs/3. A negative voltage may be applied to active bit lines while 9 volts is applied to an active word line to de-imprint a cell in a write hard one operation. Here passive word lines may receive 0 V to avoid disturb voltages on neighboring cells in excess of the disturb voltage threshold, for example, Vs/3. Thus, only the active imprinted cells receive the increased voltage levels.

Figure 8:
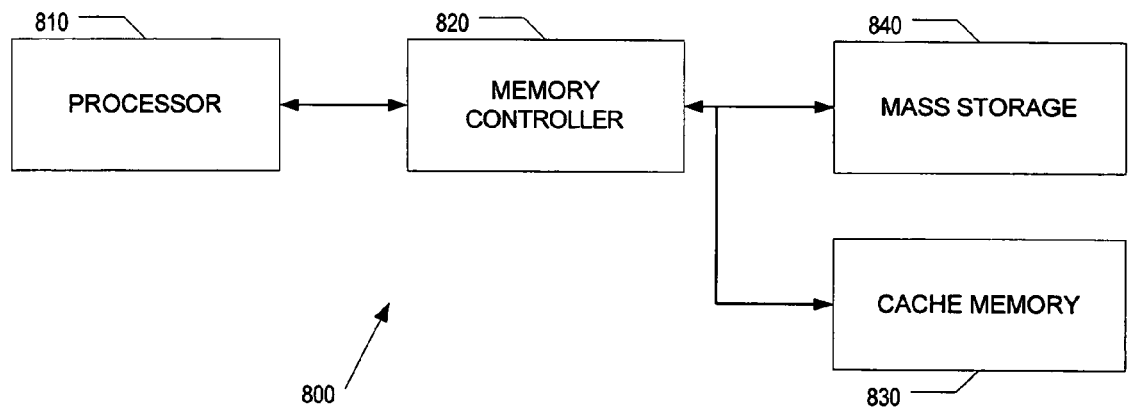
FIG. 8 is a block diagram illustrating a portion of a computing system according to an embodiment of the present invention.

Turning to FIG. 8, shown is a block diagram of a computing system 800 in accordance with an embodiment of the present invention. As shown in FIG. 8, in one embodiment computing system 800 may include a processor 810, a memory controller 820, a cache memory 830, and a mass storage 840. Processor 810 may be a general-purpose or special-purpose processor such as a microprocessor, microcontroller, application specific integrated circuit (ASIC), a programmable gate array (PGA), or the like.

In one embodiment, cache memory 830 may be a relatively large non-volatile disk cache memory adapted to cache information for mass storage 840. For example, cache memory 830 may be a ferroelectric polymer memory. Mass storage 840 may be a mass storage device such as, for example, a disk memory having a storage capacity of at least about one gigabyte. Mass storage 840 may be an electro-mechanical hard disk memory, an optical disk memory, or a magnetic disk memory, although the scope of the present invention is not limited in this respect. In one embodiment, cache memory 830 may have a storage capacity of at least about 500 megabytes and may include ferroelectric memory cells, wherein each cell includes a ferroelectric polymer material located between at least two conductive lines. The ferroelectric polymer material may be a ferroelectric polarizable material. In various embodiments, the ferroelectric polymer material may comprise a polyvinyl fluoride, a polyethylene fluoride, a polyvinyl chloride, a polyethylene chloride, a polyacrylonitrile, a polyamide, copolymers thereof, or combinations thereof.

In an alternate embodiment, cache memory 830 may be another type of plastic memory such as, for example, a resistive change polymer memory. In this embodiment, the plastic memory may include a thin film of polymer memory material sandwiched at the nodes of an address matrix. The resistance at any node may be altered from a few hundred ohms to several megohms by applying an electric potential across the polymer memory material to apply a positive or negative current through the polymer material to alter the resistance of the polymer material. Potentially different resistance levels may store several bits per cell and data density may be increased further by stacking layers.

The memory of the apparatus may be a ferroelectric polymer memory, a ferroelectric oxide memory, or any other ferroelectric memory, although the scope of the present invention is not limited in this respect. In alternate embodiments, the memory may also be a non-ferroelectric memory.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A method comprising:
   determining if a memory cell is imprinted; and
   if imprinted, applying a positive voltage, not including zero, to one of a bit line and a word line and applying a negative voltage, not including zero, to the other of the bit line and the word line to write the memory cell to a specified logic state.

2. The method as recited in claim 1, further comprising:
   if not imprinted, applying positive voltages greater than or equal to zero to the bit line and the word line to write the memory cell to a specified logic state.

3. The method as recited in claim 1, wherein determining if a memory cell is imprinted comprises monitoring an access history of the memory cell.

4. The method as recited in claim 1, wherein determining if a memory cell is imprinted comprises determining that a system comprising the memory cell was powered off.

5. The method as recited in claim 1, wherein the applying the positive voltage to one of the bit line and the word line and the applying the negative voltage to the other of the bit line and the word line comprises providing a voltage level above Vs to the memory cell sufficient to de-imprint the memory cell, where Vs is a switching voltage of the memory cell if not imprinted.

6. The method as recited in claim 1, wherein imprinted is a state of a memory cell that requires an increased voltage to reverse a polarity of the memory cell.

7. The method as recited in claim 1, wherein the applying the positive voltage to one of the bit line and the word line and the applying the negative voltage to the other of the bit line and the word line comprises preventing a disturb voltage on neighboring cells from exceeding a disturb voltage threshold.

8. The method as recited in claim 1, wherein the memory cell is a non-volatile polymer ferroelectric memory cell.

9. An apparatus comprising:
   memory array; and
   a memory controller to determine if a memory cell of the memory array is imprinted and to apply a positive voltage not including zero to one of a bit line and a word line and apply a negative voltage not including zero to the other of the bit line and the word line if the memory cell is imprinted to write the memory cell to a specified logic state.

10. The apparatus as recited in claim 9, the memory controller further to apply positive voltages greater than or equal to zero to the bit line and the word line if the memory cell is not imprinted to write the memory cell to a specified logic state.

11. The apparatus as recited in claim 9, wherein to determine if a memory cell is imprinted, the memory controller is further to monitor an access history of the memory cell.

12. The apparatus as recited in claim 9, wherein to determine if a memory cell is imprinted, the memory controller is further to determine that a system comprising the memory cell was powered off.

13. The apparatus as recited in claim 9, wherein to apply the positive voltage to one of the bit line and the word line and to apply the negative voltage to the other of the bit line and the word line, the memory controller is further to provide a voltage level above Vs to the memory cell sufficient to de-imprint the memory cell wherein Vs is a switching voltage of the memory cell if not imprinted.

14. The apparatus as recited in claim 9, wherein imprinted is a state of the memory cell that requires an increased voltage to reverse a polarity of the memory cell.

15. The apparatus as recited in claim 9, wherein to apply the positive voltage to one of the bit line and the word line and to apply the negative voltage to the other of the bit line and the word line, the memory controller is further to prevent a disturb voltage on neighboring cells from exceeding a disturb voltage threshold.

16. The apparatus as recited in claim 9, wherein the memory cell is a non-volatile polymer ferroelectric memory cell.

17. A system comprising:
   a disk memory;
   memory array coupled to the disk memory to cache information for the disk memory; and
   a memory controller to determine if a memory cell of the memory array is imprinted and to apply a positive voltage not including zero to one of a bit line and a word line and apply a negative voltage not including zero to the other of the bit line and the word line if the memory cell is imprinted to write the memory cell to a specified logic state.

18. The system as recited in claim 17, the memory controller further to apply positive voltages greater than or equal to zero to the bit line and the word line if the memory cell is not imprinted to write the memory cell to a specified logic state.

19. The system as recited in claim 17, wherein to determine if a memory cell is imprinted, the memory controller is further to monitor an access history of the memory cell.

20. The system as recited in claim 17, wherein to determine if a memory cell is imprinted, the memory controller is further to determine that a system comprising the memory cell was powered off.

21. The system as recited in claim 17, wherein to apply the positive voltage to one of the bit line and the word line and to apply the negative voltage to the other of the bit line and the word line, the memory controller is further to provide a voltage level above Vs to the memory cell sufficient to de-imprint the memory cell wherein Vs is a switching voltage of the memory cell if not imprinted.

22. The system as recited in claim 17, wherein imprinted is a state of the memory cell that requires an increased voltage to reverse a polarity of the memory cell.

23. The system as recited in claim 17, wherein to apply the positive voltage to one of the bit line and the word line and to apply the negative voltage to the other of the bit line and the word line, the memory controller is further to prevent a disturb voltage on neighboring cells from exceeding a disturb voltage threshold.

24. The system as recited in claim 17, wherein the memory cell is a non-volatile polymer ferroelectric memory cell.

* * * * *